(12) United States Patent
Best et al.

(10) Patent No.: US 10,133,693 B2
(45) Date of Patent: Nov. 20, 2018

(54) COORDINATING MEMORY OPERATIONS USING MEMORY-DEVICE GENERATED REFERENCE SIGNALS

(71) Applicant: Rambus Inc., Sunnyvale, CA (US)

(72) Inventors: Scott C. Best, Palo Alto, CA (US); Ian Shaeffer, Los Gatos, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 15/827,825

(22) Filed: Nov. 30, 2017

(65) Prior Publication Data

US 2018/0150420 A1 May 31, 2018

Related U.S. Application Data

(63) Continuation of application No. 15/173,932, filed on Jun. 6, 2016, now Pat. No. 9,858,216, which is a (Continued)

(51) Int. Cl.
*G06F 12/00* (2006.01)
*G06F 13/00* (2006.01)
*G06F 13/16* (2006.01)
*G06F 3/06* (2006.01)
*G11C 11/4076* (2006.01)
(Continued)

(52) U.S. Cl.
CPC .......... *G06F 13/1689* (2013.01); *G06F 3/061* (2013.01); *G06F 3/0659* (2013.01); *G06F 3/0683* (2013.01); *G11C 11/409* (2013.01); *G11C 11/4076* (2013.01); *G11C 11/4093* (2013.01); *Y02D 10/14* (2018.01)

(58) Field of Classification Search
None
See application file for complete search history.

(56) References Cited

U.S. PATENT DOCUMENTS 6,353,559 B2   3/2002   Hasegawa et al.
6,768,693 B2   7/2004   Feurle et al.
(Continued)

OTHER PUBLICATIONS

International Preliminary Report on Patentability(Chapter I) dated Sep. 7, 2012 in International Application No. PCT/US10/058542. 6 pages.

(Continued)

*Primary Examiner* — Sean D Rossiter
(74) *Attorney, Agent, or Firm* — Silicon Edge Law Group LLP; Arthur J. Behiel (57) ABSTRACT

A memory system includes a memory controller coupled to multiple memory devices. Each memory device includes an oscillator that generates an internal reference signal that oscillates at a frequency that is a function of physical device structures within the memory device. The frequencies of the internal reference signals are thus device specific. Each memory device develops a shared reference signal from its internal reference signal and communicates the shared reference signal to the common memory controller. The memory controller uses the shared reference signals to recover device-specific frequency information from each memory device, and then communicates with each memory device at a frequency compatible with the corresponding internal reference signal.

20 Claims, 8 Drawing Sheets

Related U.S. Application Data continuation of application No. 13/577,838, filed as application No. PCT/US2010/058542 on Dec. 1, 2010, now Pat. No. 9,384,152.

(60) Provisional application No. 61/307,266, filed on Feb. 23, 2010.

(51) Int. Cl.
  *G11C 11/409* (2006.01)
  *G11C 11/4093* (2006.01)

(56) References Cited

U.S. PATENT DOCUMENTS

| | | | |
|---|---|---|---|
| 7,071,757 B2 | 7/2006 | Bonaccio et al. | |
| 9,136,199 B2* | 9/2015 | Kartal | H01L 27/0255 |
| 2001/0055222 A1* | 12/2001 | Banks | G11C 11/5621 |
| | | | 365/185.03 |
| 2003/0107936 A1* | 6/2003 | Jung | G11C 7/04 |
| | | | 365/211 |
| 2003/0231537 A1 | 12/2003 | Stark | |
| 2004/0078510 A1 | 4/2004 | Spriggs et al. | |
| 2004/0136420 A1* | 7/2004 | Robinson | H01S 5/042 |
| | | | 372/34 |
| 2004/0236910 A1 | 11/2004 | Kozakai et al. | |
| 2006/0236105 A1 | 10/2006 | Brok et al. | |
| 2006/0280015 A1 | 12/2006 | Okuyama | |
| 2006/0285408 A1* | 12/2006 | Betser | G11C 16/3404 |
| | | | 365/212 |
| 2007/0101086 A1 | 5/2007 | Ferraiolo et al. | |
| 2007/0255919 A1 | 11/2007 | Tsern et al. | |
| 2007/0274147 A1* | 11/2007 | Egerer | G11C 11/406 |
| | | | 365/222 |
| 2009/0077423 A1 | 3/2009 | Kim et al. | |
| 2010/0118632 A1 | 5/2010 | Ma et al. | |
| 2010/0134163 A1* | 6/2010 | Kawamoto | H03L 7/0995 |
| | | | 327/157 |
| 2010/0164476 A1 | 7/2010 | Molchanov et al. | |
| 2010/0214029 A1* | 8/2010 | McDonald | H03L 7/23 |
| | | | 331/18 |
| 2011/0241787 A1 | 10/2011 | Mastovich | |
| 2012/0319738 A1* | 12/2012 | Nakamura | H03L 1/022 |
| | | | 327/102 |
| 2013/0145084 A1 | 6/2013 | Hiromatsu et al. | |
| 2013/0328634 A1* | 12/2013 | Filipovic | H03L 1/022 |
| | | | 331/70 |
| 2015/0049849 A1* | 2/2015 | Chen | G06F 1/06 |
| | | | 375/376 |
| 2015/0052378 A1* | 2/2015 | Chen | G06F 12/0246 |
| | | | 713/501 |
| 2015/0063403 A1* | 3/2015 | Cho | G01K 1/028 |
| | | | 374/1 |
| 2015/0063420 A1* | 3/2015 | Cho | G01K 7/01 |
| | | | 374/170 |
| 2015/0301932 A1* | 10/2015 | Oh | G06F 11/00 |
| | | | 711/102 |

OTHER PUBLICATIONS

Pangjun et al., "Low-Power Clock Distribution Using Multiple Voltages and Reduced Swings", IEEE transactions on Very Large Scale Integration (VLSI) systems, vol. 10, No. 3, Jun. 2002, pp. 309-318. 10 pages.

PCT Search Report and the Written Opinion dated Aug. 2, 2011 re Int'l. Application No. PCT/US2010/058542. 11 Pages.

PCT Statement under Article 19(1) submitted Aug. 18, 2011 re PCT Int'l. Application No. PCT/2010/058542. 27 Pages.

PCT Supplemental Statement under Article 19 Statement under Article 19(1) submittedOct. 18, 2011 re PCT Int'l. Application No. PCT/US2010/058542. 4 Pages.

Ta, Paul D. et al., "A Low Power Clock Distribution Scheme for Complex IC System", ASIC Conference and Exhibit, 1991. Proceedings, Fourth Annual IEEE International Rochester, NY, USA Sep. 23-27, 1991, New York, NY, USA, IEEE, US Sep. 23, 1991 (Sep. 23, 1991), pp. P1-5.1 to P1-5.4, XP010048471.

Yoon, Sangwoong, "LC-tank CMOS Voltage-Controlled Oscillators using High Quality Inductors Embedded in Advanced Packaging Technologies," PhD Thesis, Dec. 2004, Georgia Institute of Technology. 140 pages.

* cited by examiner

COORDINATING MEMORY OPERATIONS USING MEMORY-DEVICE GENERATED REFERENCE SIGNALS

FIELD OF THE INVENTION

The field of the invention generally relates to memory systems and more particularly to methods and systems for coordinating one or more types of operations in a memory system.

BACKGROUND

Memory controllers are digital circuits that manage the flow of data to and from a computer's main memory. Memory controllers can be implemented as a special-purpose integrated circuit (IC), or can be integrated with a general-purpose IC, e.g. a control processing unit (CPU). Main memory, typically dynamic random-access memory (DRAM), can likewise be implemented as a special-purpose IC or integrated with other functionality.

Computer memory systems are commonly synchronous, which means that operations between the controller and the memory device or devices are synchronized to a shared timing reference. The shared timing reference is typically a clock signal external to both the controller and the memory device.

A shared timing reference may be too noisy or otherwise unsuitable for supporting internal operations in the memory device. Each controller and memory device in a given system can therefore include control circuitry that generates a stable internal timing reference signal from the relatively noisy external reference. The relatively stable internal timing references are then used to synchronize communication between devices. Unfortunately, the circuitry commonly used to generate, control and distribute an internal timing reference based on a shared external reference tends to be complex and power hungry.

DETAILED DESCRIPTION

Figure 1:
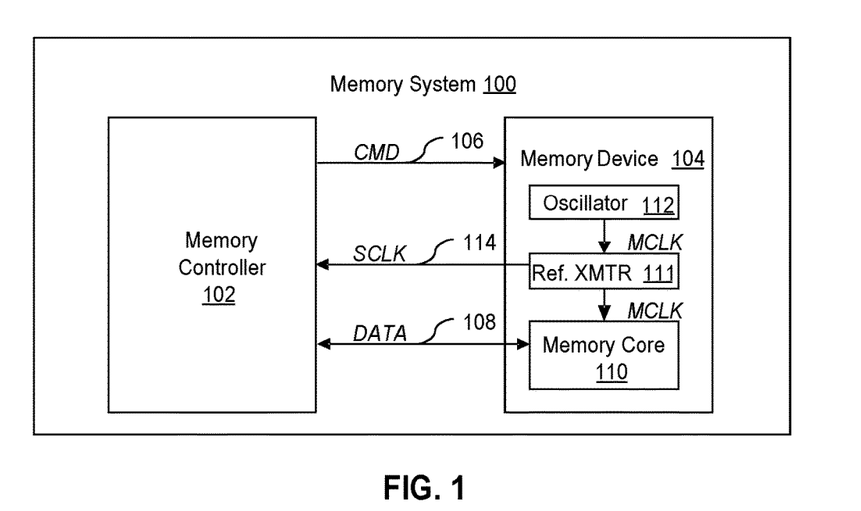
FIG. 1 is a block diagram representation of one embodiment of a memory system.

FIG. 1 depicts a synchronous memory system 100 in which a memory controller 102 is synchronized with a memory device 104 using relatively simple and efficient clock generation circuitry within the memory device.

The memory device 104 includes an integrated oscillator 112 that generates an internal reference signal MCLK. This internal reference signal is used to time various operations in the memory device 104, such as the reading and writing of data to and from the memory controller 102 via a data channel 108.

The oscillation frequency of internal reference signal MCLK is a function of the properties of integrated physical structures on the memory device 104. These properties can differ between memory devices due to process variations, so the frequency of internal reference signal MCLK is device-specific. The frequency of the device-specific internal reference signal MCLK determines the bit rate of data communications with memory controller 102, so the communication bit rate of the memory device 104 is likewise device specific. The memory device 104 therefore passes the memory controller 102 a shared reference signal SCLK that provides the memory controller with a measure of the frequency of internal reference signal MCLK, and consequently allows the memory controller 102 to communicate at the device-specific bit rate of the memory device 104.

Oscillator 112 does not have to recover internal reference signal MCLK from a noisy external reference signal, and is not required to oscillate at a specific frequency to communicate with controller 102. Oscillator 112 can therefore be implemented using circuitry that is simpler, less expensive, and more power efficient than control circuitry that must lock to an external timing signal and maintain a specific phase and frequency.

A reference transmitter 111 derives shared reference signal SCLK from the internal reference signal MCLK and transmits the shared reference signal SCLK to the memory controller 102 via a reference channel 114. In one embodiment shared reference signal SCLK is a clock or strobe signal that oscillates at an integer fraction of the internal reference signal MCLK. That is to say, despite the use of the letters "CLK" in the term "SCLK," or references to a clock, any timing reference may be used, generated and/transmitted, whether in the form of a clock signal, a strobe signal, some form of embedded timing, or some other form of timing indication. Irrespective of form, the memory controller 102 can use the shared reference signal as a frequency reference when communicating with memory device 104.

Memory controller 102 can include relatively complex and power-hungry control circuitry to generate a stable reference signal from the shared reference signal (e.g., SCLK). Complexity and power usage at the controller side of memory system 100, rather than at the memory side, is advantageous however because there are typically more memory devices than memory controllers in a given system, because the transistors in the memory controller are typically higher performance (and therefore more power efficient) than that of a memory device, and because memory devices are more of a commodity product than memory controllers, and are thus more cost sensitive.

Memory controller 102 issues commands CMD to memory device 104 via a command bus 106. Examples of such controller commands include a read command, a write command, a read data address, a write data address, mask information and a maintenance operation command. Memory device 104 responds to such commands by coordinating memory operations, such as the reading and writing of data 108 from and to a memory core 110. In one embodiment, these core operations are performed at a frequency derived from reference signal MCLK. Memory controller 102 may be e.g. a central processing unit (CPU) or a graphics processing unit (GPU), and the memory device 104 may be one of several dynamic random access memory (DRAM) device The memory controller 102 and the memory device 104 transmit data to each other via a bidirectional data bus 108. More specifically, the memory controller 102 transmits write data to the memory device 104 via the data bus 108 and the memory device 104 transmits read data to the memory controller 102 via the data bus 108. Separate unidirectional data buses may be included in other embodiments.

Memory core 110 includes DRAM memory cells and related circuitry in this example, but may include other types of memory resources in other embodiments. Memory core 110 is used to store the write data received at the memory device 104. The memory device 104 performs memory core operations associated with the storage of write data to the memory core 110 and the retrieval of read data from the memory core 110.

In one embodiment, the memory device 104 transmits the shared reference signal SCLK to the memory controller 102 via a unidirectional bus 114. In one embodiment, the bus 114 is a dedicated link between the memory device 104 and the memory controller 102 that is only used to transmit the reference signal SCLK. In one embodiment, the memory device 104 includes a dedicated SCLK signal output for transmission of the shared reference signal from the memory device 104. The memory controller 102 can likewise include a dedicated input for receiving the shared reference signal SCLK. The memory device 104 may continuously transmit the reference signals SCLK, or may periodically transmit the reference signal, e.g. responsive to requests from the memory controller 102. The shared reference signal SCLK need not be a dedicated signal, such as for example a simple periodic clock signal or a strobe signal, as the memory controller 102 can recover the frequency information from other types of signals (e.g., a serial data sequence encoded to insure some minimum transition-density).

The memory controller 102 uses the frequency information in the shared reference signal SCLK to coordinate data transmissions with the memory device 104 via the bidirectional data bus 108. More specifically, the memory controller 102 uses the shared reference signal to coordinate the reception of read data transmitted from the memory device 104, and the memory controller 102 uses the shared reference signal to coordinate the transmission of write data to the memory device 104. Since SCLK is derived from reference signal MCLK, the memory device 104 can use MCLK to coordinate the transmission of read data to the memory controller 102, and to coordinate reception of write data from the memory controller.

The memory controller 102 uses a processor reference clock (PCLK) signal to coordinate one or more different types of controller operations. In one embodiment, the memory controller 102 coordinates the transmission of controller commands from the memory controller 102 to the memory device 104 based on the PCLK signal. In this embodiment, the memory controller 102 transmits the PCLK signal to the memory device 104. The memory device 104 then uses the received PCLK signal to coordinate the reception of commands CMD on bus 106, and to coordinate memory core operations at the memory device 104. In one embodiment, therefore, the bus 106 that is used to deliver commands CMD from the controller 102 to memory device 104 includes a clock signal that is used by the memory device to coordinate reception of commands.

In another embodiment, the memory controller 102 coordinates the transmission of controller commands from the memory controller 102 to the memory device 104 based on the PCLK signal. In this embodiment, the memory controller 102 transmits the PCLK signal to the memory device 104, and the memory device 104 then uses the received PCLK signal to coordinate the reception of commands CMD on bus 106. However, in this embodiment, the memory device 104 coordinates memory core operations based on a clock derived from reference signal MCLK generated at the memory device 104. For example, since memory core operations are typically much slower than memory data operations, the memory device 104 may use an integer fraction of the reference signal MCLK to coordinate memory core operations. The reduced frequency version of the reference signal MCLK that the memory device 104 uses to coordinate memory core operations may have a frequency that approximates the frequency of the PCLK signal.

In another embodiment, the memory controller 102 coordinates the transmission of controller commands from the memory controller 102 to the memory device 104 based on a clock signal derived from the shared reference signal SCLK. In this embodiment, the shared reference signal SCLK is an integer fraction of the reference signal MCLK, and may have a frequency that approximates the frequency of the PCLK signal. In this embodiment, the memory controller 102 may transmit the clock signal derived from the shared reference signal SCLK to the memory device 104, and the memory device 104 then uses the received clock signal to coordinate the reception of commands CMD on bus 106. The memory device 104 may then coordinate memory core operations based on either the received clock signal, or, in an alternative embodiment, based on an integer fraction of the reference signal MCLK generated at the memory device 104. In still another embodiment, the memory controller 102 may transmit commands CMD to the memory device 104 via bus 106, and the memory device 104 uses an integer fraction of the reference signal MCLK to coordinate the reception of these commands.

The memory controller 102 and the memory device 104 may be embodied on different integrated circuits, in which case both devices may be included on the same circuit board or on different modules electrically attached to the same circuit board. In one embodiment, the memory device 104 is a semiconductor package including a semiconductor die. In one embodiment, the oscillator 112 is a resonant clock circuit (e.g., an "LC oscillator") and the entire resonant clock circuit is disposed on the semiconductor die. A portion of the resonant clock circuit may be disposed on the semiconductor die and a portion of the resonant clock circuit off the semiconductor die and within the semiconductor package. The memory controller and memory device may each be flip chip mounted to a common substrate, for example, together as part of a common die or in some stacked-package manner (e.g., "package-on-package", a.k.a., "PoP") suitable for portable devices, such as a cell phone or other portable device.

While the memory system 100 has been described as including a memory controller 102 coupled to a memory device 104, other types of memory systems may include other types of external devices (e.g., load-reduction buffers) coupled to the memory device 104 that use the shared reference signals SCLK to interface with the memory device 104. Also, while a memory system including a single memory controller coupled to a single memory device has been described, one or more memory controllers can communicate with one or more memory devices in other embodiments.

It should be noted that the embodiments described above enable fabrication and use of relatively simple, power efficient memory devices. By generating its own timing signal, e.g., through an embedded oscillator, each memory device (e.g., a DRAM IC device) may be freed from having to have PLL's and other power-hungry circuitry that might be needed to lock to an external timing source. In some implementations, the generated timing signal may be directly used for transmission and/or receipt of communication signals. That is to say, a least one system design using the embodiments presented above can optionally have any and all signal phase alignment performed at the side of the memory controller, such that the memory controller not only frequency aligns transmissions to a particular memory device, but also can introduce phase compensation such that transmissions to the memory device arrive in synchronicity with the memory timing signal (i.e., MCLK in the examples above). Similarly, where a memory device uses its internally generated timing signals to transmit data to the memory controller, the memory device can transmit the data without phase adjustment, with the controller performing any needed phase adjustment in order to properly time its sampling of received data. More detail on these embodiments will be presented below.

Figure 2:
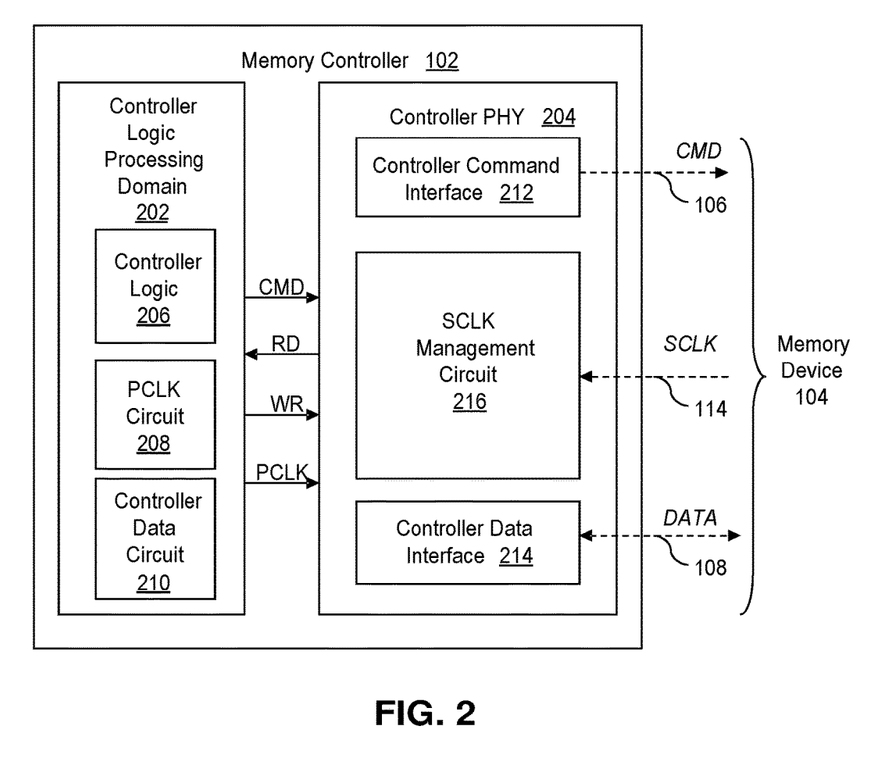
FIG. 2 is a block diagram representation of one embodiment of the memory controller of FIG. 1.

FIG. 2 is a block diagram representation of one embodiment of the memory controller 102 of FIG. 1. The memory controller 102 generally includes a controller logic processing domain 202 communicatively coupled to a physical interface (PHY) 204. The controller PHY 204 is a physical layer electrical interface that transmits and receives communications to and from a memory device 104.

The controller logic processing domain 202 generally includes controller logic 206, a processor reference clock (PCLK) circuit 208 and a controller data circuit 210. The controller logic 206 generally interfaces with a microcontroller or microprocessor of some sort (not shown), and performs operations specific to a memory controller (e.g., queuing, scheduling, reordering, etc). The PCLK circuit 208 generates the processor reference signal PCLK, which serves as the timing reference for data transactions (including but not limited to commands CMD, read data RD, and write data WR) between controller logic processing domain 202 and the PHY 204. Controller logic processing domain operations are typically coordinated in the controller logic processing domain 202 based on either the PCLK signal or an integer multiple of it. The controller data circuit 210 generally receives read data from the PHY 204 (which in turn receives it from memory device 104), and transmits both commands and write data to the PHY 204 (which in turn transmits it to the memory device 104).

The controller PHY 204 generally includes a controller command interface 212, a controller data interface 214, and an SCLK management circuit 216. The controller command interface 212 receives controller commands CMD from the controller data circuit 210 for transmission to the memory device 104. The controller command interface 212 transmits the received controller commands to the memory device 104 via the command bus 106, which is unidirectional in this example. Note also that, in some embodiments, command bus 106 includes a clock signal for use by the memory device to coordinate reception of these commands.

The controller data interface 214 receives write data WR from the controller data circuit 210 for transmission to the memory device 104. The controller data interface 214 transmits the received write data to the memory device 104 via the bidirectional data bus 108. The controller data interface 214 also relays read data RD from the memory device 104 via the bidirectional data bus 108 to controller data circuit 210 for processing in the controller logic processing domain 202.

The SCLK management circuit 216 in the memory controller receives the shared reference signal SCLK from the memory device 104 via the unidirectional SCLK bus 114. In one embodiment, the shared reference signal SCLK is a buffered version of the reference clock signal MCLK generated by the memory device 104. In another embodiment, the shared reference signal SCLK is a clock signal (either free-running or an intermittent strobe) oscillating at a reduced frequency (e.g., an integer ratio) of the reference signal MCLK generated by the memory device 104. In still other embodiments, the shared timing reference is an encoded data signal that includes a sufficient transition density to deliver frequency information about reference signal MCLK (generated by the memory device 104) to controller 102. Such encoded data signals may convey information other than frequency, such as memory device status codes, or error-correction codes which may be used to fortify the signal integrity between the controller and the memory device. The SCLK management circuit 216 includes a clock synthesis circuit, such as a phase-locked loop (PLL), that uses the shared reference signal SCLK to generate a new clock signal oscillating at the frequency of the reference signal MCLK generated by the memory device 104. In other embodiments, the clock synthesis circuit, such as a delay-locked loop (DLL) circuit, may not generate a single clock signal oscillating at the frequency of the reference clock signal MCLK, but may instead generate multiple, evenly-spaced phases of a new clock signal, where the number of multiple phases combined with the new frequency corresponds to the MCLK frequency (e.g., 4 phases at 1.6 GHz can be used to accomplish operations at 6.4 GHz). To accomplish this correctly, the clock synthesis circuit may be pre-configured with the ratio of MCLK to SCLK used by memory device 104. For example, if SCLK was the buffered output of a divide-by-eight circuit running off of MCLK, then the clock synthesis circuit could be registered-programmed or pin-configured with the integer value of "8" in order for it to correctly reproduce the new clock signal running at the same frequency as MCLK. In alternative embodiments, the MCLK to SCLK ratio could be constant (i.e., set to a fixed value during design stage) in the clock synthesis circuit and programmable on the memory device, it could be programmable on both sides, or it could even be constant on both sides.

The controller data interface 214 transmits write data to the memory device 104 based on an output of the clock synthesis circuit. In one embodiment, the controller data interface 214 is able to operate over a range of clock signal frequencies rather than, e.g., at a specific pre-defined frequency. The frequency of the shared reference signal SCLK received from the memory device 104 may then define the specific frequency that the controller data interface 214 uses to coordinate write data transmissions to the memory device 104. For example, controller data interface 214 may operate over a frequency range from approximately 4 GHz to approximately 6 GHz. The frequency of the reference signal MCLK generated by the oscillator 112 at the memory device 104 can be targeted (during the design stage) at, for example, 5 GHz, which may vary +/−20% due to manufacturing variation. An exemplary device could, for example, produce an oscillation frequency of 5.6 GHz, which falls within the operational range of the controller data interface 214. The 5.6 GHz frequency in this example would then define the operating frequency of the controller data interface 214. The ability of memory controller 102 to communicate using a range of frequencies allows the memory controller to operate using whatever frequency is provided by its relatively simple and efficient oscillator 112 on memory device 104.

The controller command interface 212 typically operates at a lower frequency than the controller data interface 214. In one embodiment, the controller command interface 212 transmits controller commands to the memory device 104 based on the PCLK signal received from the PCLK circuit 208. An example of a frequency for a typical PCLK signal is 400 MHz. Note that in this example, as described earlier, the controller command interface would also transmit a buffered version of this PCLK signal as part of command bus 106, for use in command reception by memory device 104.

In one embodiment, in addition to generating a new clock signal running at the same frequency as reference signal MCLK, the clock synthesis circuit within the SCLK management circuit 216 generates a reduced frequency clock signal that is an integer fraction of the new clock signal. This reduced frequency clock signal may or may not oscillate at the same frequency as the shared reference signal SCLK. The controller command interface 212 then transmits controller commands to the memory device 104 based on this reduced frequency clock signal. Continuing the earlier example, the oscillator 112 on memory device 104 may oscillate at a frequency of 5.6 GHz, and an encoded data signal using single data-rate signaling running at 0.7 Gbps is transmitted by the memory device 104 to the controller 102 via the SCLK bus. The clock synthesis circuit is then programmed with the integer value of 8 to generate the 5.5 GHz new clock signal based on this SCLK signal, and uses a divide-by-16 circuit to generate a 350 MHz reduced clock signal that is used to coordinate transmissions of commands from the controller interface circuit 212 to the memory device 104.

While a number of different components of the memory controller 102 have been described, the memory controller 102 may include additional components that facilitate the performance of memory controller operations.

Figure 3:
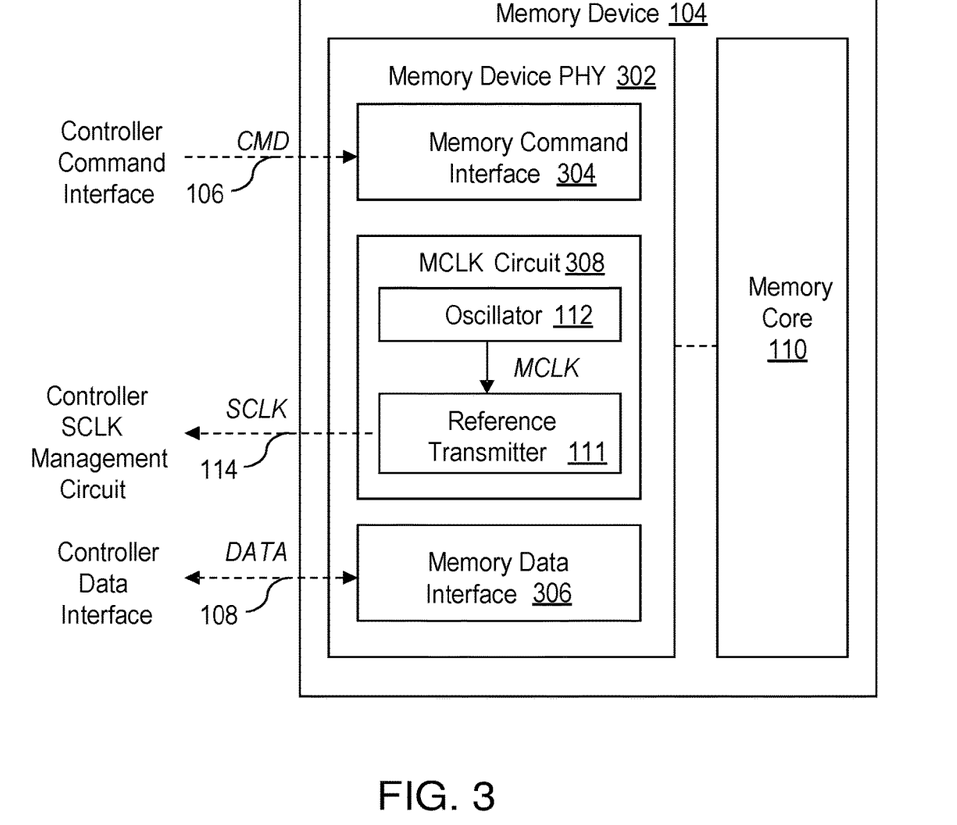
FIG. 3 is a block diagram representation of one embodiment of the memory device of FIG. 1.

Referring to FIG. 3, a block diagram representation of one embodiment of a memory device 104 of FIG. 1 is shown. The memory device 104 generally includes a memory PHY 302 communicatively coupled to the memory core 110. The memory PHY 302 is a physical layer interface that generally receives communications from an external device at the memory device chip and transmits communications from the memory device 104 off the memory device chip to the external device. In one embodiment, the external device is a memory controller 102.

Memory values are stored in the memory core 110. The memory device 104 stores write data received from the memory controller 102 in the memory core 110 responsive to a write command received from the memory controller 102 and retrieves read data from the memory core 110 for transmission to the memory controller 102 responsive to a read command received from the memory controller 102.

The memory device PHY 302 generally includes a memory command interface 304, a memory data interface 306 and an MCLK circuit 308. The memory command interface 304 receives controller commands CMD from the memory controller 102 via the command bus 106.

The memory data interface 306 receives and transmits write and read data DATA from and to the memory controller 102. More specifically, during a write operation, the memory data interface 306 receives write data WR from the controller data interface 214 and the memory device 104 stores the received write data in the memory core 110 responsive to a write command received at the memory command interface 304 from the controller command interface 212. And during a read operation, the memory command interface 304 receives a read command from the controller command interface 212. The memory device 104 responsively retrieves the requested read data RD from the memory core 110 and the memory data interface 306 transmits the retrieved read data to the controller data interface 214.

The MCLK circuit 308 includes the oscillator 112 and the reference transmitter 111. The oscillator 112 generates the reference signal MCLK. The oscillator 112 does not rely on any timing references external to the memory device 104 to either generate the reference signal MCLK or to tune the reference signal MCLK. In one embodiment, the oscillator 112 includes a resonant clock circuit, such as an LC oscillator. The reference transmitter 111 receives the reference signal MCLK generated by the oscillator 112 and transmits the shared reference signal SCLK to the memory controller 102. Reference transmitter 111 may transmit other types of frequency-reference signals. In other embodiments, the reference transmitter 111 divides the MCLK signal by a fixed integer ratio prior to transmitting the divided-down signal as signal SCLK. In still further embodiments, the division ratio is programmable (e.g., by registers, by external pins, etc.).

The memory data interface 306 coordinates its transmission of read data to the controller data interface 214 of the memory controller 102 based on the reference signal MCLK generated by the oscillator 112. In one embodiment, the memory data interface 306 is configured to operate over a range of clock signal frequencies. In other words, the memory data interface 306 is not pre-configured to operate at a specific pre-defined frequency. The frequency of the reference signal MCLK generated by the oscillator 112 defines the specific frequency that the memory data interface 306 uses to coordinate read data transmissions to the controller data interface 214.

For example, a memory data interface 306 may be configured to operate over a frequency range from approximately 4 GHz to approximately 6 GHz. The frequency of the reference signal MCLK generated by the oscillator 112 falls within the operational range of the memory data interface 306 and defines the operating frequency of the memory data interface 306.

The memory command interface 304 may operate at a relatively lower frequency than the reference signal MCLK. In one embodiment, the memory command interface 304 receives controller commands that were transmitted from the controller command interface 212 based on the PCLK signal. In this embodiment, the controller additionally transmits the PCLK signal to the memory device, for use in command reception by memory command interface 304.

In one embodiment, the memory controller 102 generates a lower frequency version of the shared reference signal SCLK (e.g., by using a divider circuit) and the controller command interface 212 transmits controller commands to the memory command interface 304 based on this reduced frequency reference. In this embodiment, the memory device also generates a lower frequency version of the shared reference signal SCLK (e.g., by using a divider circuit with a division ratio matching that of the controller) for use in command reception by memory command interface 304.

The memory core 110 may operate at a relatively lower frequency than that of the reference signal MCLK. In one embodiment, the memory controller 102 transmits the PCLK signal to the memory device 104 and the memory device 104 uses the received PCLK signal to coordinate the performance of memory core operations. In other embodiments, the memory device may coordinate memory core operations using a divided-down (i.e., reduced-frequency) version of either the reference signal MCLK, the shared reference signal SCLK, or the received PCLK signal.

The memory controller 102 may also program registers within the memory device (e.g., the "extended mode registers" that are common to modern DRAM's) to control the division ratio used by the memory device. These programmable dividers may be used to divide-down the reference signal MCLK as part of generating the shared reference signal SCLK, or as part of generating the signal used to coordinate the performance of memory core operations. Note that while registers are the most efficient means for a memory controller to configure the operation of a memory device in a system, these programmable dividers can be controlled in other ways (e.g., by external pins of the memory device).

While a number of different components of the memory device 104 have been described, the memory device 104 may include additional components that facilitate the performance of the memory device operations.

Figure 4:
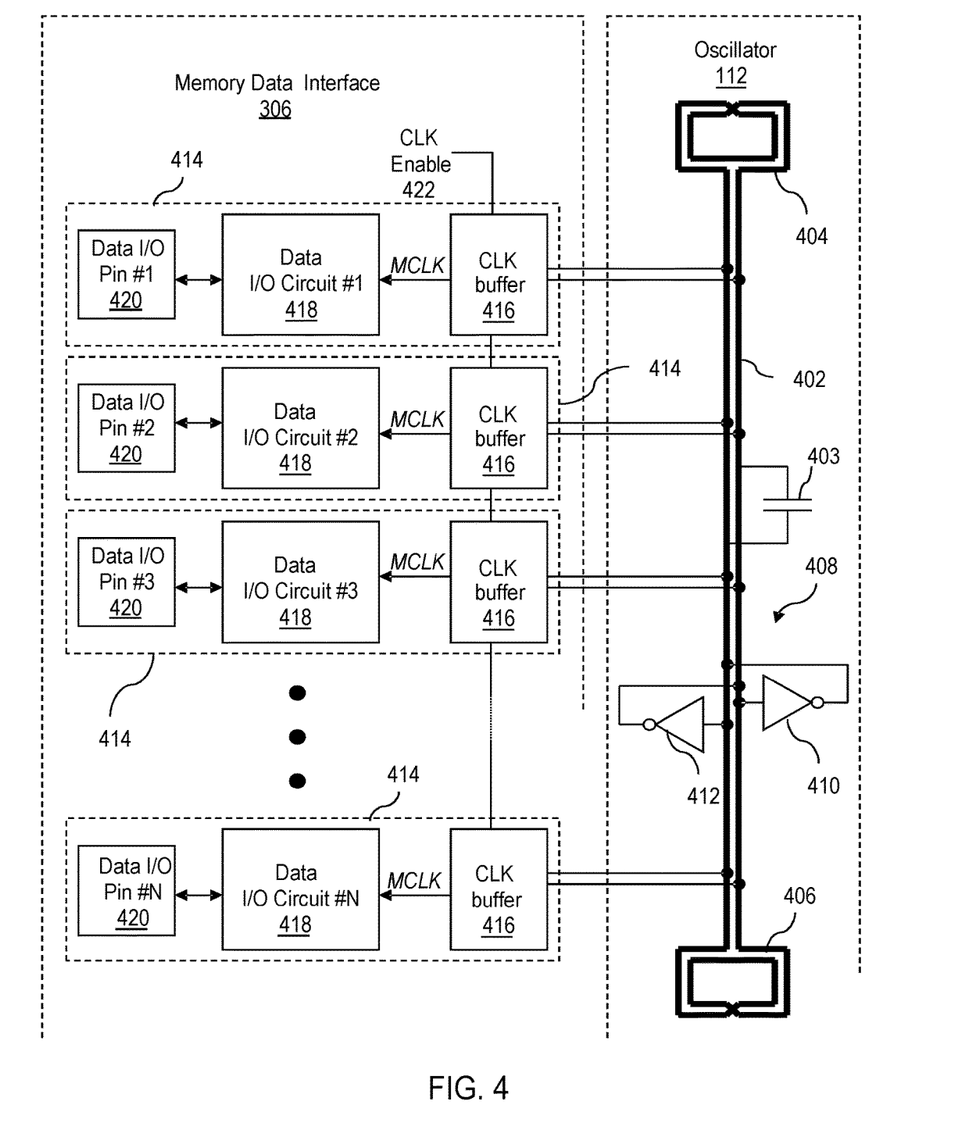
FIG. 4 is a block diagram representation of one embodiment of the oscillator communicatively coupled to the memory data interface of FIG. 3.

Referring to FIG. 4, a block diagram representation of one embodiment of the oscillator 112 communicatively coupled to the memory date interface 306 of FIG. 3 is shown. The oscillator 112 produces a sustained alternating waveform of frequency f that serves as internal reference signal MCLK. Oscillator 112 is itself a resonator, and thus produces signal MCLK without reliance upon an external timing signal. Absent an external timing reference, the frequency f of internal reference signal MCLK is primarily a function of resonant physical structures on the memory IC. In the depicted example, the structures define an LC tank circuit, the resonant frequency of which is determined by the inductance (L) associated with a pair of inductors 404 and 406, and a capacitance (C) associated with capacitor 403 (which includes parasitic capacitance of clock distribution network 402).

The inductors 404 and 406 may be e.g. one or more flat differential spiral coils formed in the uppermost conductive layers of the memory device's on-chip wiring. In other embodiments, the inductor elements may be integrated within the memory device packaging, connected to external pins on the memory device, or even register adjustable to coarse-tune the oscillator's resonant frequency. The capacitance 403 represents both the parasitic capacitance of the clock signal wiring itself as well as any discrete capacitors that are coupled in parallel with inductors 404 and 406, and that consequently impact the oscillation frequency f of oscillator 112. As is well known, resonant LC circuits of the type shown in FIG. 4 resonate at a frequency that is primarily a function of the inductance L associated with inductors 404 and 406 and capacitance C associated with capacitor 403. Other parameters, such as resistance and supply voltage, also play a role in determining the resonant frequency. To a first approximation, however, the resonant frequency f of oscillator 112 can be represented using Equation (1) below.

$$\text{Resonant Frequency} = \sqrt{1/LC} \qquad \text{Equation (1)}$$

The value C of capacitance 403 is a function of the size of the clock distribution network and the dielectric thickness between metal layers and within switching elements. Dielectric thickness can vary between memory devices due to e.g. process variations, so the capacitance can likewise vary. In other embodiments, the capacitive elements may be integrated within the memory device packaging, connected to external pins on the memory device, or even register adjustable to coarse-tune the oscillator's resonant frequency. Because the exact values of capacitance and inductance will vary with process, and the resonant frequency f is a function of the inductance and capacitance, the resonant frequency f of oscillator source 112 likewise varies with process (e.g., wafer-to-wafer and die-to-die fabrication process variation). Other parameters that affect the resonant frequency vary with process, supply-voltage, and operating temperature. As a result, different resonant LC clock circuits disposed in different memory devices 104 generate reference signals MCLK of different frequencies. Other embodiments may use other types of integrated resonators that are similarly affected by process, voltage, and temperature variations. Note that by including the parasitic wiring of the clock distribution network as part of the "C" used by the resonant oscillator, the power consumption of the clock network is approximately reduced by the "Q" (i.e., the quality factor) of the oscillator.

The exemplary resonant oscillator shown in 112 includes a regeneration circuit 408 to replenish energy losses due to parasitic resistance in the resonant LC clock circuit. Note that there are many regeneration circuits common in the art of LC oscillators. In one embodiment, the power regeneration circuit 408 includes a pair of cross-coupled inverters 410 and 412. In another embodiment, the power regeneration circuit can be built using cross-coupled differential transistor pair with a current-source bias. Note that if the regeneration circuit is deactivated (e.g., by a programmable register command sent by the memory controller to the memory device, or by the de-assertion of an external pin on the memory device), the oscillator 112 will gradually stop oscillating as it transitions into a low power state (e.g., when no data transactions with the DRAM are required). In this embodiment, oscillations can be restarted by a re-enablement of the regeneration circuit when data transactions are again required.

Clock distribution network 402 distributes the MCLK clock signal generated by oscillator 112 to the memory data interface 306. As mentioned previously, the memory data interface 306 transmits read data to the controller data interface 214 of the memory controller 102 based on the reference signal MCLK generated by the oscillator 112. The memory data interface 306 transmits a pre-defined number of data bits to the controller data interface 214 during a single read data transmission and receives the pre-defined number of data bits from the controller data interface 214 during a single write data transmission. The memory data interface 306 includes a plurality of data circuits 414 where each of the plurality of data circuits 414 is associated with the IO width of the memory device. For example, the IO width of the memory device may be 32 bits (e.g., a ×32 DRAM), and the memory data interface 306 transmits and receives 256 data bits to and from the controller data interface 214 during a single read and write data transmission respectively, using 32 data circuits 414, each of which perform 8:1 serialization (for writes) and deserialization (for reads).

Each data circuit 414 includes a clock buffer circuit 416, a data input/output (I/O) circuit 418 (which may include the serializer and deserializer circuits) and a data input/output (I/O) pin 420. The reference signal MCLK generated by the resonant LC clock circuit is distributed to each of the clock buffers 416 associated with each of the data circuits 414 via the clock signal distribution network 402 (the parasitic capacitance of which, in some embodiments, is part of oscillator 112's "C" value). The clock buffer 416 buffers the received reference signal MCLK. When the clock buffers 416 are enabled via the clock enable signal 422 (e.g., when read or write data transactions are required), each of the clock buffers 416 transmit the reference signal MCLK to the associated data I/O circuit 418. In other embodiments, the clock enable signal 422 may activated and/or deactivated by: specific commands sent by the memory controller via the command bus 106, by programmable register commands sent by the memory controller to the memory device, or by the assertion/de-assertion of an external pin on the memory device. Other techniques for selectively enabling the clock enable signal 422 are also possible, and not limited to the above techniques.

A single read transmission includes a plurality of data bits. During a read operation, each of the plurality of data I/O circuits 418 typically serializes several bits of data, and transmits the serial data to the associated data I/O pin 420 for transmission to the controller data interface 214 of the memory controller 102. During a write operation, the data I/O pins 420 collectively receive a plurality of data bits associated with a single write data transmission from the controller data interface 214 of the memory controller 102 at approximately the same time. The data bits received at each of the data I/O pins 420 are typically transmitted to the associated data I/O circuit 418 for deserialization. Each of the clock buffers 416 transmits the reference signal MCLK to the associated data I/O circuit 418 responsive to a clock enable signal. In general, each of the data I/O circuits 418 coordinates both the reception of write data and transmission of read data with the buffered reference signal MCLK from the associated clock buffer 416.

While one example of an oscillator 112 has been described, alternative types of oscillators that do not rely on an external timing reference signal to either generate or tune the reference signal MCLK may be used. Also while one configuration of a resonant LC clock circuit has been described, alternative configurations of a resonant LC clock circuit may be used. For example, oscillator 112 may include a voltage regulator to ensure a stable supply voltage for the regeneration circuitry. Furthermore, while one configuration of a memory data interface 306 has been described, alternative configurations of a memory data interface 306 may be used.

Figure 5:
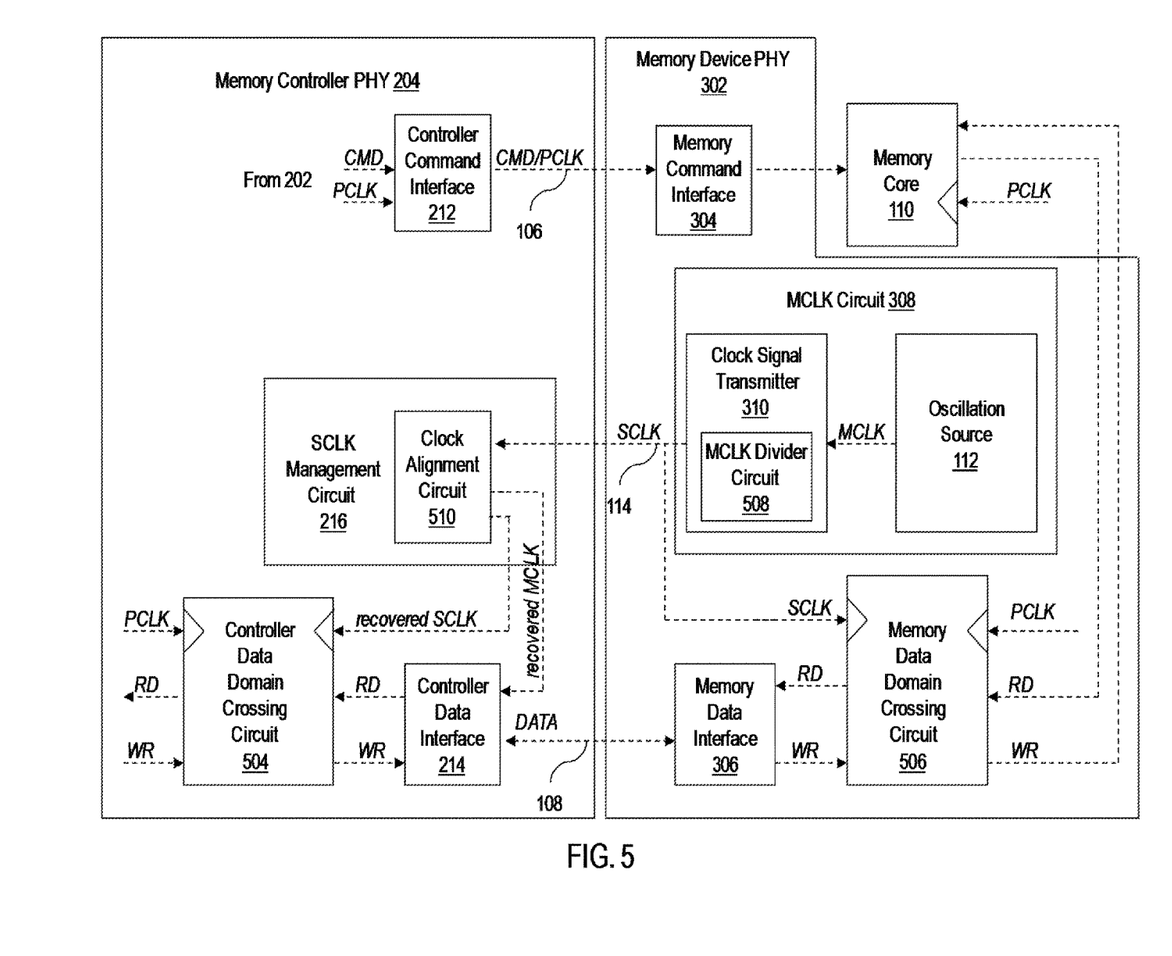
FIG. 5 is a block diagram representation of one embodiment of the controller PHY of FIG. 2 communicatively coupled to the memory device PHY of FIG. 3 including two different operational time domains.

Referring to FIG. 5, a block diagram representation of one embodiment of a controller PHY 204 of FIG. 2 communicatively coupled to a memory device PHY 302 and memory core 110 of FIG. 3 including two different operational time domains is shown. As described above in connection with FIG. 2, the controller PHY 204 generally includes the PCLK circuit 208, command interface 212, controller data interface 214 and SCLK management circuit 216. In this embodiment, the controller PHY also includes a controller data domain crossing circuit 504. As described above in connection with FIG. 3, the memory device PHY 302 includes the memory command interface 304, memory data interface 306, and MCLK circuit 308. Memory device PHY 302 may additionally include a memory data domain crossing circuit 506.

As described earlier, the MCLK circuit 308 at the memory device 104 generally includes an oscillator 112 and a shared reference transmitter 111. The oscillator 112 generates the reference signal MCLK. The oscillator 112 does not rely on any timing references external to the memory device 104 to either generate the reference signal MCLK or to tune the reference signal MCLK. In one embodiment, the oscillator 112 is a resonant clock circuit, such as a resonant LC circuit.

As described earlier, the reference signal MCLK is electrically coupled to the shared reference transmitter 111, which includes an MCLK divider circuit 508. The MCLK divider circuit 508 divides the frequency of the received reference signal MCLK thereby generating a reduced frequency version of the reference signal MCLK. Typically, as described earlier, the resulting shared reference signal SCLK is a programmable integer ratio of MCLK (e.g., SCLK may be one-eighth the frequency of MCLK). The clock signal transmitter 310 transmits the reduced frequency version of the MCLK signal to the SCLK management circuit 216 of the memory controller 102 via the unidirectional SCLK bus 114. The SCLK management circuit 216 includes a clock alignment circuit 510, which locks to the shared reference signal SCLK received via the SCLK bus 114. The clock alignment circuit 510 may include a locked-loop circuit, such as a PLL or DLL. In some embodiments, the clock alignment circuit handles both frequency alignment and phase alignment, and as mentioned above, if desired, the alignment may include compensation for phase offsets associated with the transmission and/or receipt of data or commands over conductive pathways which connect the controller and the memory device. Generally speaking, further phase adjustment may not be necessary for receipt of data if the memory device reference signal is transmitted in a manner that is embedded, or whether transmission paths are matched to the pathways used for read data.

Still referring to FIG. 5, the controller coordinates data transactions between the processing domain of the memory controller (not shown) and the memory controller PHY 204 based on processor clock PCLK. In one embodiment, the controller command interface 212 receives both the command data CMD and processor clock signal PCLK from the controller processing domain and transmits them to the memory command interface 304 via the command bus 106.

In this embodiment, the memory command interface 304 captures the command signal CMD using edge-transitions of the PCLK signal as the sampled-receiver timing reference. The memory device 104 also coordinates the performance of memory core operations in the memory core 110, including but not limited to the issuance of memory core operations associated with the received controller command, based on the received PCLK signal.

In cases where the controller command received from the controller command interface 212 at the memory command interface 304 is a read data command, the requested read data is retrieved from the memory core 110 based on the PCLK signal. In this embodiment, the retrieved read data is loaded into the memory data domain crossing circuit 506 again based on the PCLK signal. In this embodiment, the memory data interface 306 then retrieves the read data from the memory data domain crossing circuit 506 based on the shared reference signal SCLK and then transmits the retrieved read data to the controller data interface 214 via the data bus 108 based on the reference signal MCLK generated by the oscillator 112.

The read data is received from the memory data interface 306 at the controller data interface 214 and is loaded into the controller data domain crossing circuit 504 based on the timing associated with the recovered reference signal MCLK (that is, a clock signal whose frequency matches that of the MCLK signal generated by oscillation source 112 and was "recovered" from the SCLK signal 114 via the clock alignment circuit 510). The controller logic processing domain then retrieves the read data from the controller data domain crossing circuit 504 based on the PCLK signal. In the embodiment describe above and in FIG. 5, the memory data domain crossing circuit 506 and controller data domain crossing circuit 504 may both be straightforward FIFO circuits, which are commonly used for transacting data from one clocking domain to another.

In this embodiment, in the case of write operations, the controller logic processing domain transmits write data to the controller data domain crossing circuit 504 based on the PCLK signal. The controller data interface 214 then retrieves the write data from the controller data domain crossing circuit 504 based on a clock signal associated with the reference signal MCLK (e.g., based on a recovered shared reference clock signal SCLK), and then transmits the retrieved write data to the memory data interface 306 via the data bus 108 based on the recovered reference signal MCLK generated by the clock alignment circuit 510.

Continuing this embodiment's write mode of operation, the write data is received from the controller data interface 214 at the memory data interface 306 and is loaded into the memory data domain crossing circuit 506 based on the timing associated with the shared reference signal SCLK (which is itself derived from the reference signal MCLK generated by oscillator 112). The memory core 110 then retrieves the write data from the memory data domain crossing circuit 506 based on the PCLK signal, and stores the retrieved write data in the memory core 110 based on core commands managed by the memory command interface 304 (which in this embodiment operates in the PCLK clocking domain).

Figure 6:
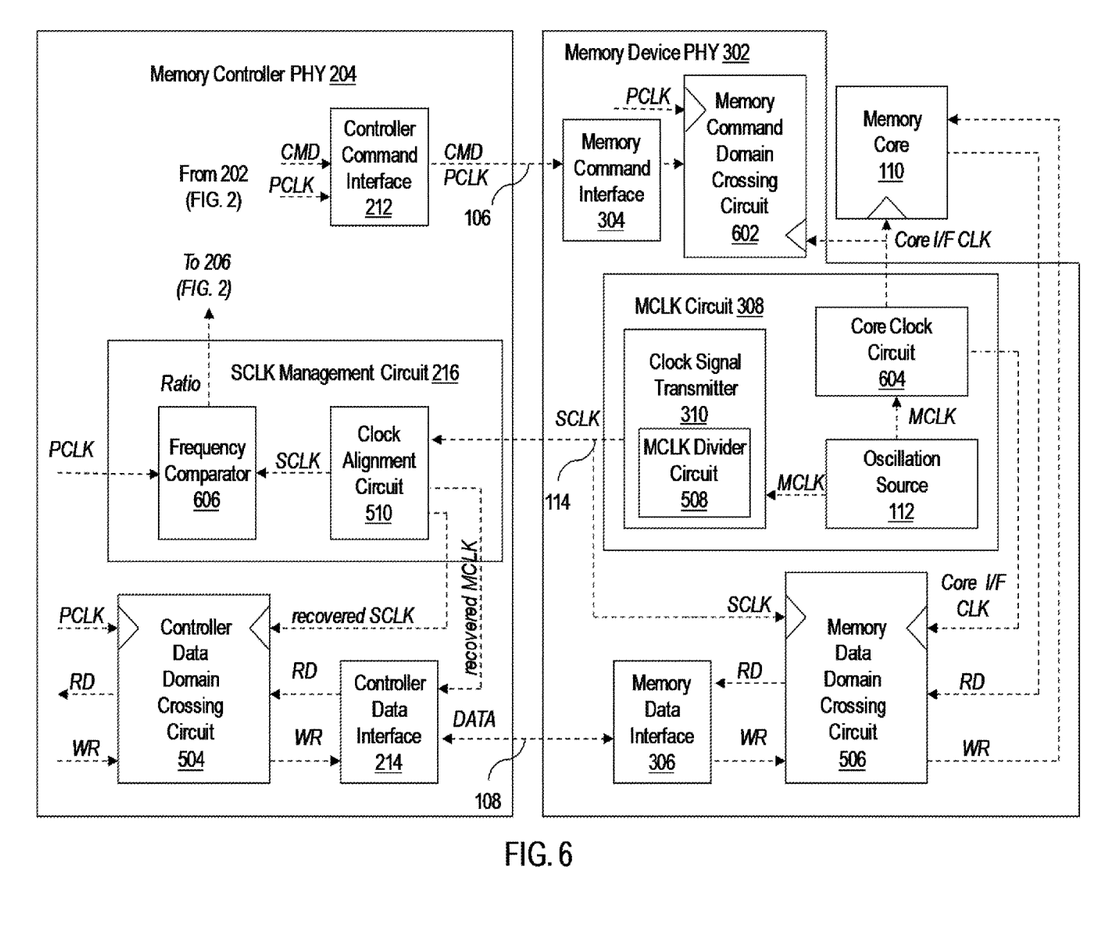
FIG. 6 is a block diagram representation of one embodiment of the controller PHY of FIG. 2 communicatively coupled to the memory device PHY of FIG. 3 including three different operational time domains.

Note that the FIG. 5 embodiment describes just one solution for where the data domain crossing circuits (e.g., FIFO circuits) can be situated. In other embodiments, for example, there could be a FIFO between the memory command interface 304 and the memory core that could achieve the same results. Referring to FIG. 6, for example, a block diagram representation of one embodiment of a controller PHY 204 of FIG. 2 communicatively coupled to a memory device PHY 302 and memory core 110 of FIG. 3 including three different operational time domains is shown. This embodiment is similar to the one discussed above in connection with FIG. 5, with like-identified elements being the same or similar. A detailed discussion of features common to FIGS. 5 and 6 is omitted for brevity.

On the memory side of FIG. 6, device PHY 302 includes a memory command domain crossing circuit 602 that retimes commands CMD from a first clock domain timed to the PCLK signal to a second clock domain timed to a second clock domain timed to a core interface clock signal (labeled as "Core I/F CLK" in FIG. 6) derived from the timing reference signal MCLK that is local to the memory device. The MCLK circuit 308 in this example includes a core clock circuit 604 that divides down the reference signal MCLK to produce the low-frequency core interface clock signal. Note that in this embodiment, the core interface clock and the shared timing reference SCLK are essentially derived from the same frequency source MCLK, and this common-frequency relationship can simplify the design considerations of the memory data domain crossing circuit 506.

On the controller side of FIG. 6, the SCLK management circuit 216 includes a frequency comparator 606 in this embodiment. The frequency comparator 606 receives the PCLK signal from the controller logic processing domain 202 (FIG. 2) and the recovered reference signal MCLK from the clock alignment circuit 510 as inputs. The frequency comparator 606 determines an approximate frequency ratio between the reference signal MCLK and the PCLK signal, and generates a signal ratio value to controller logic 206 (FIG. 2) representative of that comparison. In one embodiment, the approximate frequency ratio is an integer value. The controller logic 206 issues controller commands to program the core clock circuit 604 in the MCLK circuit 308 at the memory device 104 to divide the frequency of the reference signal MCLK generated by the oscillator 112 by the determined approximate frequency ratio such that the core clock circuit 604 generates a core interface clock signal using that ratio value. In one embodiment, the reduced frequency version of the reference signal MCLK approximates the frequency of the PCLK signal. For example, a PCLK signal may have a frequency of approximately 400 MHz while the core interface clock signal may be programmed to one-fourteenth of the MCLK reference signal (oscillating in this example at 5.5 GHz), resulting in a core interface clock oscillating at approximately 393 MHz. Note that by selectively controlling the division ratio of the core clock circuit, one can nearly match the two frequency values, which helps simplify the design of domain crossing circuits 602 and 506.

Continuing with the embodiment show in FIG. 6, commands received at command interface 304 are captured by domain crossing circuit 602 on edges of the PCLK signal. The memory core 110 retrieves the controller command from the memory command domain crossing circuit 602 based on the reduced frequency core interface clock signal generated by the core clock circuit 604. The memory device 104 coordinates the performance of memory core operations in the memory core 110, including but not limited to the implementation memory core operations associated with the received controller command, based on the reduced core interface clock signal generated by the core clock circuit 604.

In this embodiment, in the cases where the controller command CMD is a read data command, the requested read data is retrieved from the memory core 110 based on the core interface clock signal generated by the core clock circuit 604. The retrieved read data is then loaded into the memory data domain crossing circuit 506 based on the reduced frequency core interface clock signal generated by the core clock circuit 604. The memory data interface 306 retrieves the read data from the memory data domain crossing circuit 506 and transmits the retrieved read data to the controller data interface 214 via the data bus 108 based on the reference signal MCLK generated by the oscillator 112.

Continuing with the embodiment of FIG. 6, the read data is received from the memory data interface 306 at the controller data interface 214 (using the recovered reference clock signal MCLK) and is loaded into the controller data domain crossing circuit 504 based on the timing associated with the recovered shared reference signal SCLK. The controller data circuit 210 in the controller logic processing domain 202 then retrieves the read data from the controller data domain crossing circuit 504 based on the PCLK signal.

In this embodiment, in the cases where the controller command received from the controller command interface 212 at the memory command interface 304 is a write command, write data WR is loaded into the controller data domain crossing circuit 504 is retrieved by the recovered shared timing reference SCLK for transmission to the memory device based on the recovered timing reference MCLK. The write data WR is received based on the timing reference signal MCLK generated by oscillator 112, and is loaded into domain crossing circuit 506 based on the shared timing reference SCLK. The memory core 110 then retrieves the write data from the memory data domain crossing circuit 506 based on the core interface clock and stores the retrieved write data. As with the embodiment shown in FIG. 5, the domain crossing circuits in the embodiment shown in FIG. 6 may be implemented using straightforward FIFO circuits which are common in the art.

Figure 7:
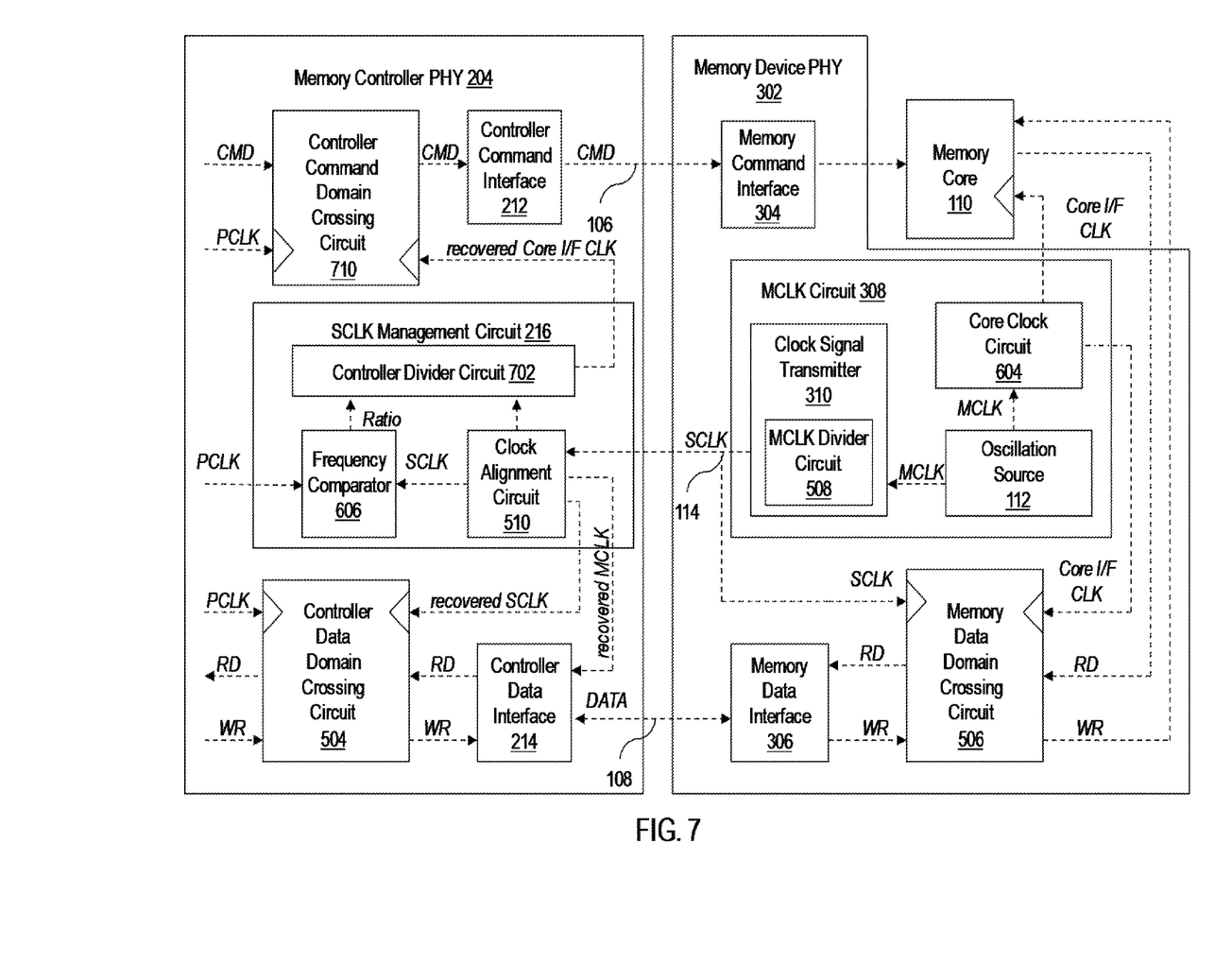
FIG. 7 is a block diagram representation of one embodiment of the controller PHY of FIG. 2 communicatively coupled to the memory device PHY of FIG. 3 including three different operational time domains.

Referring to FIG. 7, a block diagram representation of one embodiment of a controller PHY 204 of FIG. 2 communicatively coupled to a memory device PHY 302 and memory core 110 of FIG. 3 including three different operational time domains is shown. This embodiment is similar to the one discussed above in connection with FIGS. 5 and 6, with like-identified elements being the same or similar. A detailed discussion of the above-discussed features is omitted for brevity.

In this embodiment, the core interface clock that is created in the memory PHY 302 is reproduced on the memory controller PHY 204. That is, this embodiment includes not only a recovered MCLK and SCLK, but also a recovered core interface clock as well. Similar to other embodiments, the SCLK management circuit 216 includes a clock alignment circuit 510, a frequency comparator 606 and a controller divider circuit 702. As before, the clock alignment circuit 510 locks to the shared reference signal SCLK received via the SCLK bus 114, and the frequency comparator 606 determines an approximate frequency ratio value between the shared reference signal SCLK and the PCLK signal. The controller divider circuit 702 then generates a recovered core interface clock signal that operates at an integer ratio of SCLK (which itself is an integer ratio of MCLK), as determined by the frequency ratio value.

The signal Ratio from comparator 606 also goes to the controller logic 206, which issues controller commands to program the core clock circuit 604 in the MCLK circuit 308 at the memory device 104 to divide the frequency of the reference signal MCLK generated by the oscillator 112 by the determined approximate frequency ratio such that the core clock circuit 604 generates the reduced frequency version of the reference signal MCLK. In other words, the two core interface clocks are now operating at exactly the same frequency (both the same integer ratio of MCLK).

In this embodiment, controller PHY 204 includes a command domain crossing circuit 710 that retimes command signal CMD from the PCLK domain to a second domain timed to the recovered core interface clock signal from divider circuit 702. Interfaces 212 and 304 and memory core 110 are all timed to this same frequency, which eliminates the need of a clock domain crossing circuit in the command path of the DRAM (as was shown in FIG. 6).

Figure 8:
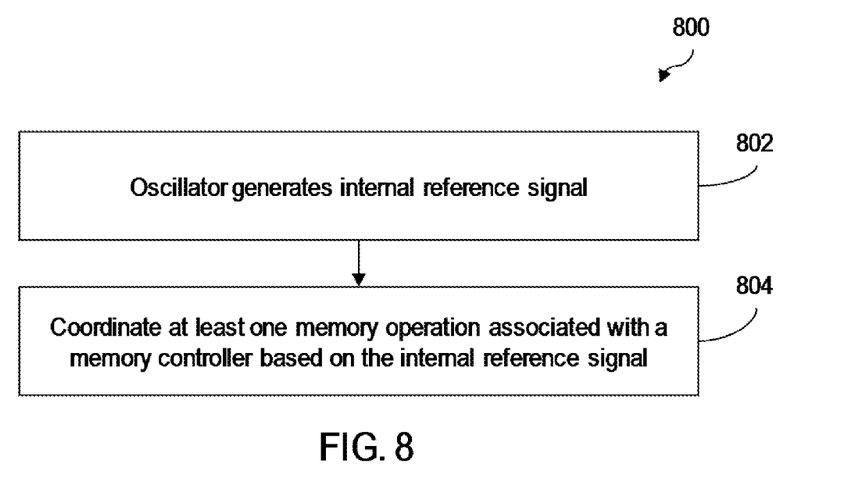
FIG. 8 is a flowchart representation of one embodiment of a method of coordinating a memory operation in a memory system.

Referring to FIG. 8, a flowchart representation of one embodiment of a method 800 of coordinating a memory operation in a memory system 100 is shown. Oscillator 112 generates an internal reference signal MCLK of a resonant frequency that is a function of physical attributes of the memory device (802). The internal reference signal MCLK is not phase or frequency adjusted with reference to an external timing reference signal. At least one memory operation associated with a memory controller 102 is coordinated based on the reference signal MCLK at the memory device 104 (804). This coordination may involve some form as phase adjustment, although in some embodiments, the reference signal MCLK may be directly used in the transmission or receipt of data without any form of phase adjustment, e.g., with any phase adjustments for communications performed at the controller. An example of such a memory operation is the transmission of read data from the memory device 104 to the memory controller 102.

Figure 9:
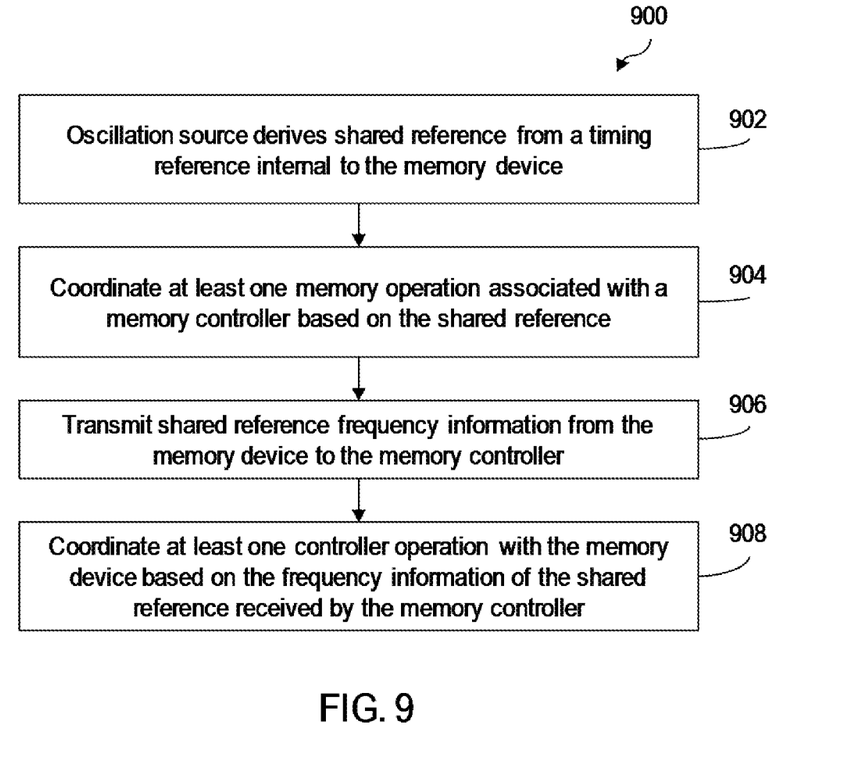
FIG. 9 is a flowchart representation of one embodiment of a method of coordinating a memory operation in a memory system.

Referring to FIG. 9, a flowchart representation of one embodiment of a method 900 of coordinating a memory operation in a memory system 100 is shown. Oscillator 112 generates signal MCLK as a timing reference internal to the memory device 104 (902). As above, the timing reference is not phase or frequency adjusted with reference to an external timing reference signal. At least one memory operation associated with a memory controller 102 is coordinated based on the reference signal MCLK at the memory device 104 (904). An example of such a memory operation is the transmission of read data from the memory device 104 to the memory controller 102. The memory device 104 transmits frequency information about the reference signal MCLK from the memory device 104 to the memory controller 102 (906). In one embodiment, this frequency information is a shared reference signal SCLK that oscillates at an integer ratio of the reference signal MLK. In one embodiment, a clock alignment circuit 510 on the memory controller 102 locks to the received shared reference signal SCLK. The memory controller 102 coordinates at least one controller operation with the memory device 104 based on the received shared reference signal SCLK at the memory controller 102. One example of such a controller operation is the transmission of write data from the memory controller 102 to the memory device 104. While the operations in the method 900 have been described as occurring in a particular order, the order and the number of operations can be different in other embodiments.

Figure 10:
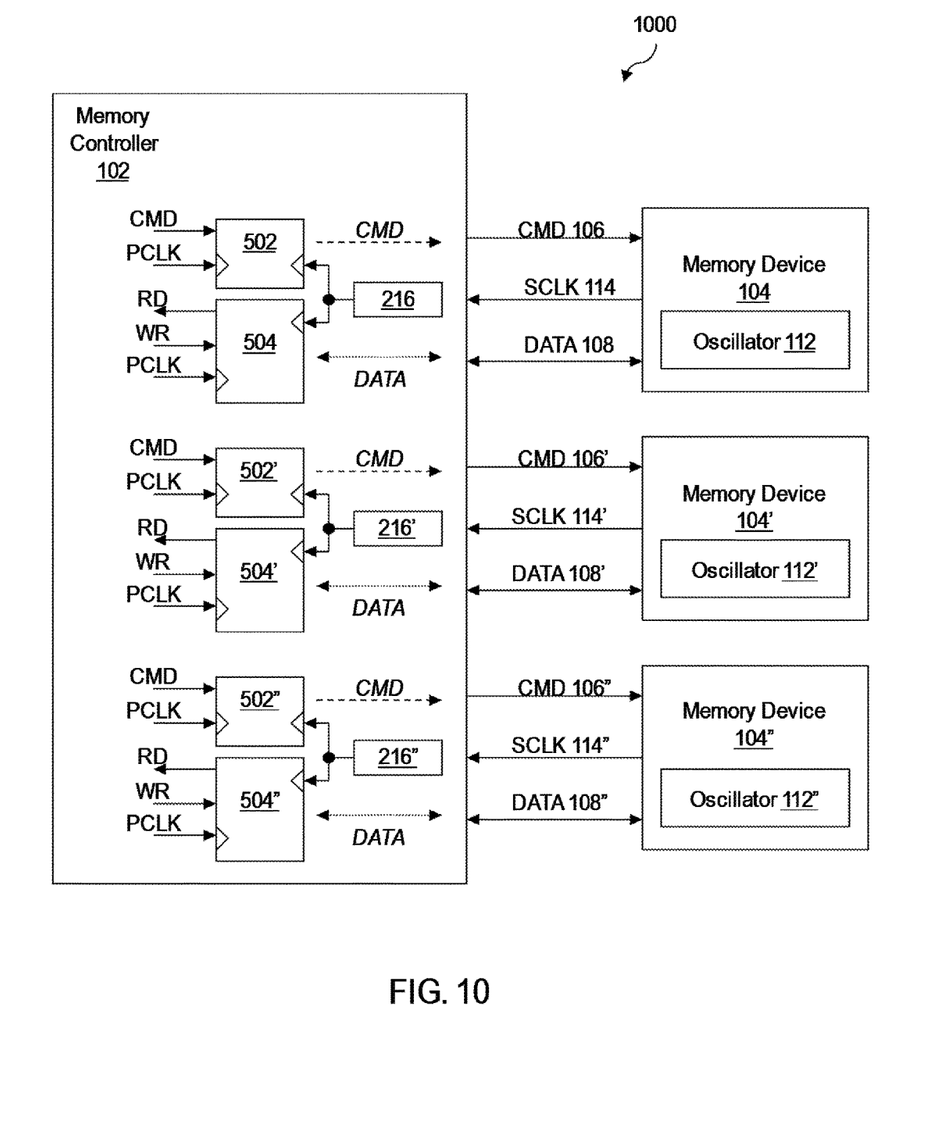
FIG. 10 is a block diagram representation of one embodiment of a memory system including a memory controller and three memory devices.

FIG. 10 is a block diagram representation of one embodiment of a memory system 1000 including a memory controller 102 and three memory devices 104, 104', 104". In one embodiment, the first, second and third memory devices 104, 104', 104" are dynamic random access memory (DRAM) devices. The first memory device 104 includes a first oscillator 112 that generates a first reference signal MCLK 114. The second memory device 104' includes a second oscillator 112' that generates a second reference signal MCLK 114'. The third memory device 104" includes a third oscillator 112" that generates a third reference signal MCLK 114". Memory devices 104, 104', and 104" may be mounted to a dedicated printed-circuit board to form a memory module, or the memory devices and controller 102 can be included on the same module.

As noted previously, resonant oscillators are subject to process, supply-voltage, and temperature variations that impact their oscillation frequency. Thus, even if memory devices 104, 104', and 104" are similar devices, the reference signals MCLK, MCLK', and MCLK" of the respective memory devices may vary. Memory controller 102 is thus adapted to communicate with the different memory devices at their respective rates. This flexibility increases the complexity of controller 102, but allows the timing circuitry internal to the memory devices to provide high-quality timing references using simple, power-efficient oscillators.

Though not shown, the memory controller 102 includes a controller logic processing domain 202 as discussed above. The controller logic processing domain 202 transmits controller commands CMD intended for the first, second, and third memory devices 104, 104', 104" to the first, second and third controller command domain crossing circuits 502, 502', 502", respectively, based on the PCLK signal. The first, second and third MCLK management circuits 216, 216', 216" generate the reduced frequency versions of the first, second and third reference signal MCLKs, 114, 114', and 114", respectively.

Controller commands intended for the first memory device 104 are retrieved from the first controller command domain crossing circuit 502 and transmitted to the first memory device 104 via the command bus 106 based on the reduced frequency version of the first reference signal MCLK generated by the first MCLK management circuit 216. Controller commands intended for the second memory device 104' are retrieved from the second controller command domain crossing circuit 502' and transmitted to the second memory device 104' via the command bus 106' based on the reduced frequency version of the second reference signal MCLK generated by the second MCLK management circuit 216'. Controller commands intended for the third memory device 104" are retrieved from the third controller command domain crossing circuit 502" and transmitted to the third memory device 104" via the command bus 106" based on the reduced frequency version of the third reference signal MCLK generated by the third MCLK management circuit 216".

The controller logic domain crossing circuit 202 transmits write data WR intended for the first, second and third memory devices 104, 104', 104" to first, second and third controller data domain crossing circuits 504, 504', 504", respectively. Write data intended for the first memory device 104 is loaded into the first controller data domain crossing circuit 504 based on the PCLK signal and is then transmitted to the first memory device 104 via the data bus 108 based on the first reference signal MCLK. The other two memory channels for memory devices 104' and 104" behave similarly.

The first memory device 104 transmits read data RD to the memory controller 102 via the data bus 108 based on the first reference signal MCLK. The transmitted read data is received at the first controller data domain crossing circuit 504. The controller logic processing domain 202 retrieves the read data from the first controller data domain crossing circuit 504 based on the PCLK signal. The other two memory channels for memory devices 104' and 104" behave similarly While a memory system 1000 including three memory devices 104, 104', 104" has been described, alternative memory systems may include more or fewer memory devices.

In the foregoing description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments.

An output of a process for designing an integrated circuit, or a portion of an integrated circuit, comprising one or more of the circuits described herein may be a computer-readable medium such as, for example, a magnetic tape or an optical or magnetic disk. The computer-readable medium may be encoded with data structures or other information describing circuitry that may be physically instantiated as an integrated circuit or portion of an integrated circuit. Although various formats may be used for such encoding, these data structures are commonly written in Caltech Intermediate Format (CIF), Calma GDS II Stream Format (GDSII), or Electronic Design Interchange Format (EDIF). Those of skill in the art of integrated circuit design can develop such data structures from schematic diagrams of the type detailed above and the corresponding descriptions and encode the data structures on computer readable medium. Those of skill in the art of integrated circuit fabrication can use such encoded data to fabricate integrated circuits comprising one or more of the circuits described herein.

While the present invention has been described in connection with specific embodiments, variations of these embodiments are also envisioned. For example, the oscillators used to provide memory reference signals can employ other types of resonators, such as programmable, voltage-controlled, or fixed micro-electrical-mechanical systems (MEMS) resonators. These examples are in no way exhaustive, as many alternatives within the scope of the claims will be obvious to those of ordinary skill in the art. Moreover, some components are shown directly connected to one another while others are shown connected via intermediate components. In each instance the method of interconnection, or "coupling," establishes some desired electrical communication between two or more circuit nodes, or terminals. Such coupling may often be accomplished using a number of circuit configurations, as will be understood by those of skill in the art. Therefore, the spirit and scope of the appended claims should not be limited to the foregoing description. In U.S. applications, only those claims specifically reciting "means for" or "step for" should be construed in the manner required under the sixth paragraph of 35 U.S.C. § 112.

What is claimed is:

1. A memory controller comprising:
   controller logic; and
   a physical interface communicatively coupled to the controller logic and operable to receive a shared reference signal from a memory device, the shared reference signal varying with an operating temperature of the memory device, and to time communication of data with the memory device to the shared reference signal.

2. The memory controller of claim 1, the physical interface including a clock synthesis circuit to generate, responsive to the shared reference signal, an internal clock signal that varies with the operating temperature of the memory device, the communication of data timed to the internal clock signal.

3. The memory controller of claim 2, wherein the communication of the data includes writing data to the memory device timed to the internal clock signal.

4. The memory controller of claim 1, further comprising:
   a second physical interface communicatively coupled to the controller logic and operable to receive a second shared reference signal from a second memory device, the second shared reference signal varying with a second operating temperature of the second memory device, the second physical interface to time communication of second data with the second memory device to the second shared reference signal.

5. The memory controller of claim 4, wherein the first-mentioned operating temperature differs from the second operating temperature.

6. The memory controller of claim 1, for use with at least two memory devices each of which transmits an associated shared reference signal to the memory controller for the memory controller to time communication with the associated memory device, wherein the memory controller has at least two controller physical interfaces each dedicated to a respective one of the at least two memory devices.

7. The memory controller of claim 6, further comprising a clock alignment circuit for each one of the at least two controller physical interfaces to adjust each of a transmit phase and a receive phase associated with at least one controller operation for the associated memory device.

8. The memory controller of claim 7, wherein the clock alignment circuit for each one of the at least two controller interfaces is operable to coordinate the at least one controller operation according to a unique frequency for each memory device, the unique frequency established by the associated shared reference signal.

9. A memory system comprising:
controller logic; and
a physical interface communicatively coupled to the controller logic and operable to receive a shared reference signal from a memory device, the shared reference signal varying with an operating temperature of the memory device, and to time communication of data with the memory device to the shared reference signal.

10. The memory system of claim 9, further comprising the memory device and a bus extending between the physical interface and the memory device to communicate the shared reference signal from the memory device to the memory controller.

11. The memory system of claim 10, further comprising:
a second memory device;
a second physical interface coupled to the controller logic and operable to receive a second shared reference signal from the second memory device; and
a second bus extending between the second physical interface and the second memory device to communicate the second shared reference signal from the second memory device to the second physical interface.

12. The memory system of claim 11, further comprising:
a first clock synthesis circuit to generate, responsive to the first-mentioned shared reference signal, a first clock signal that varies with the operating temperature of the first-mentioned memory device; and
a second clock synthesis circuit to generate, responsive to the second shared reference signal, a second clock signal that varies with the operating temperature of the second memory device.

13. The memory system of claim 10, wherein the memory device includes integrated physical structures that oscillate at a frequency that varies with the operating temperature.

14. The memory system of claim 13, the integrated physical structures forming a tank circuit.

15. A method for synchronizing a memory system, the method comprising:
developing, on a memory device, a shared reference signal of a frequency that varies with of an operating temperature of the memory device;
receiving, on a memory controller, the shared reference signal of the frequency that varies with the operating temperature of the memory device; and
timing a write operation to the shared reference signal, the write operation to write data from the memory controller to the memory device.

16. The method of claim 15, further comprising:
developing, on a second memory device, a second shared reference signal of a frequency that varies with of an operating temperature of the second memory device;
receiving, on the memory controller, the second shared reference signal of the frequency that varies with the operating temperature of the second memory device; and
timing a second write operation to the second shared reference signal, the second write operation to write data from the memory controller to the second memory device.

17. The method of claim 16, wherein the operating temperature of the first-mentioned memory device differs from the operating temperature of the second memory device.

18. The method of claim 15, further comprising deriving a clock signal from the shared reference signal and timing the write operation to the clock signal.

19. The method of claim 15, wherein the memory device is an integrated circuit comprising physical structures that oscillate at the frequency.

20. The method of claim 19, wherein the physical structures include an inductor.

* * * * *